(12) United States Patent
di Martino et al.

(10) Patent No.: US 11,243,244 B2
(45) Date of Patent: Feb. 8, 2022

(54) SWITCHED BYPASS CAPACITOR FOR COMPONENT CHARACTERIZATION

(71) Applicant: Infineon Technologies AG, Neubiberg (DE)

(72) Inventors: Stefano di Martino, Graz (AT); Philipp Franz Freidl, Graz (AT); Daniel Knauder, Graz (AT)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 16/598,532

(22) Filed: Oct. 10, 2019

(65) Prior Publication Data

US 2021/0109148 A1    Apr. 15, 2021

(51) Int. Cl.
  *G01R 31/26*    (2020.01)
  *G01R 31/28*    (2006.01)
  *G01R 1/073*    (2006.01)

(52) U.S. Cl.
  CPC ..... *G01R 31/2601* (2013.01); *G01R 1/07307* (2013.01); *G01R 31/2844* (2013.01)

(58) Field of Classification Search
  CPC ........... H01L 2224/92244; H01L 22/20; H01L 23/642; H01L 24/20; H01L 28/40; G01R 19/16552; G01R 19/165; G01R 31/3167; G01R 31/2884; G01R 31/3004; G01R 31/318505; G01R 19/0084; G01R 1/07307; G01R 31/2601; G01R 31/2839; G01R 31/2844; G01R 31/3181; G01R 31/316; G01R 31/28; H02M 3/156; H02M 3/155; H02M 3/07; G06F 1/28; G06F 30/367; G06F 11/3672; H03H 11/1291; H03H 2001/0014
  See application file for complete search history.

(56) References Cited

U.S. PATENT DOCUMENTS

| | | | | |
|---|---|---|---|---|
| 6,391,667 | B1 * | 5/2002 | Hashimoto | H02M 3/07 438/17 |
| 6,504,395 | B1 * | 1/2003 | Johnson | G01R 31/31721 324/750.02 |
| 7,342,405 | B2 * | 3/2008 | Eldridge | G01R 31/31721 324/754.03 |

(Continued)

FOREIGN PATENT DOCUMENTS

| | | |
|---|---|---|
| ES | 2395364 A1 | 2/2013 |
| WO | 2017154277 A1 | 9/2017 |

*Primary Examiner* — Vinh P Nguyen
(74) *Attorney, Agent, or Firm* — Murphy, Bilak & Homiller, PLLC (57) ABSTRACT

A method of testing a semiconductor device having a DC line configured to carry either a DC signal or a DC voltage and a circuit electrically connected to the DC line includes: during a first part of a test sequence, enabling a switch device so as to electrically connect a capacitor to the DC line via the switch device and applying a test signal to the circuit while the capacitor is electrically connected to the DC line; and during a second part of the test sequence, disabling the switch device so as to electrically disconnect the capacitor from the DC line via the switch device, injecting an AC signal onto the DC line after the capacitor is electrically disconnected from the DC line, and measuring a response of the circuit to the AC signal.

10 Claims, 6 Drawing Sheets

(56) References Cited

U.S. PATENT DOCUMENTS

| | | | |
|---|---|---|---|
| 8,427,192 B2* | 4/2013 | Barbour, II | G01R 31/34 |
| | | | 324/765.01 |
| 9,742,356 B2* | 8/2017 | Takahashi | H03F 1/0211 |
| 2008/0290882 A1 | 11/2008 | Rogers et al. | |
| 2017/0146603 A1* | 5/2017 | Qin | H02P 9/102 |

* cited by examiner

SWITCHED BYPASS CAPACITOR FOR COMPONENT CHARACTERIZATION

BACKGROUND

Some test procedures involve injecting an AC signal onto a DC supply line of a device under test (DUT), to assess whether the DUT maintains good performances in one or more key parameters with such an interferer applied onto the DC supply line. For example, power supply rejection ratio (PSRR) is widely used to assess the capability of an electronic circuit to suppress the effects of power supply variation on an output signal of the electronic circuit. However, electronic circuits typically include one or more decoupling capacitors for absorbing AC interference present on a DC supply line. Some testing procedures may require such decoupling circuitry to be disabled during part of the testing process, e.g., when measuring PSRR, to assess whether the response of the DUT to an AC interferer on a DC supply line is adequate without the decoupling circuitry.

Conventionally, a special test procedure is constructed which removes the decoupling circuitry from the DC supply line so that the decoupling circuitry is unable to direct AC interferers present on the DC supply line to a reference potential such as ground. However, such a special test procedure must avoid quick variations in current consumption of the DUT to ensure proper functionality during the test procedure.

With the increased complexity of integrated circuits and systems, a voltage drop in a DC supply line may cause a malfunction in other areas, which renders the test procedure unusable.

Thus, there is a need for an improved testing procedure, related test equipment and bypass mechanism for testing the susceptibility of semiconductor devices to AC interferers present on an internal DC supply line.

SUMMARY

According to an embodiment of a method of testing a semiconductor device having a DC line configured to carry either a DC signal or a DC voltage and a circuit electrically connected to the DC line, the method comprises: during a first part of a test sequence, enabling a switch device so as to electrically connect a capacitor to the DC line via the switch device and applying a test signal to the circuit while the capacitor is electrically connected to the DC line; and during a second part of the test sequence, disabling the switch device so as to electrically disconnect the capacitor from the DC line via the switch device, injecting an AC signal onto the DC line after the capacitor is electrically disconnected from the DC line, and measuring a response of the circuit to the AC signal.

According to an embodiment of a semiconductor device, the semiconductor device comprises: a DC line configured to carry either a DC signal or a DC voltage; a circuit electrically connected to the DC line; a capacitor; a switch device configured to electrically connect the capacitor to the DC line or electrically disconnect the capacitor from the DC line, depending on a state of the switch device; and a terminal or a register for controlling the state of the switch device, wherein in a first state, the switch device is configured to electrically connect the capacitor to the DC line, wherein in a second state, the switch device is configured to electrically disconnect the capacitor from the DC line.

According to an embodiment of an electronic test equipment apparatus, the electronic test equipment apparatus comprises: an interface for a device under test (DUT), the DUT having a DC line configured to carry either a DC signal or a DC voltage and a circuit electrically connected to the DC line, the interface comprising a capacitor and a switch device configured to electrically connect or disconnect the capacitor to the DC line of the DUT, depending on a state of the switch device; and a controller configured to control the state of the switch device during a test sequence for the DUT, wherein during a first part of the test sequence, the controller is configured to enable the switch device so as to electrically connect the capacitor to the DC line of the DUT via the switch device and apply a test signal to the DUT while the capacitor is electrically connected to the DC line, wherein during a second part of the test sequence, the controller is configured to disable the switch device so as to electrically disconnect the capacitor from the DC line of the DUT via the switch device, inject an AC signal onto the DC line after the capacitor is electrically disconnected from the DC line, and measure a response of the circuit to the AC signal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a testing procedure, related test equipment and bypass mechanism for assessing the response of semiconductor devices to AC interferers present on an internal DC voltage supply line. A decoupling structure is enabled during the part of a test sequence in which a jump in current consumption is expected, while the decoupling structure is disabled during the part of the test sequence time in which characterization of the device under test (DUT) is carried out with an AC signal present on the DC supply line of the DUT. The techniques described herein utilize the decoupling structure to maintain the DUT in a desired functional state, while presenting an ideal environment for injecting an (interferer) AC signal such as a high frequency signal during the part of the test sequence reserved for measuring the response of the DUT without decoupling enabled.

Figure 1:
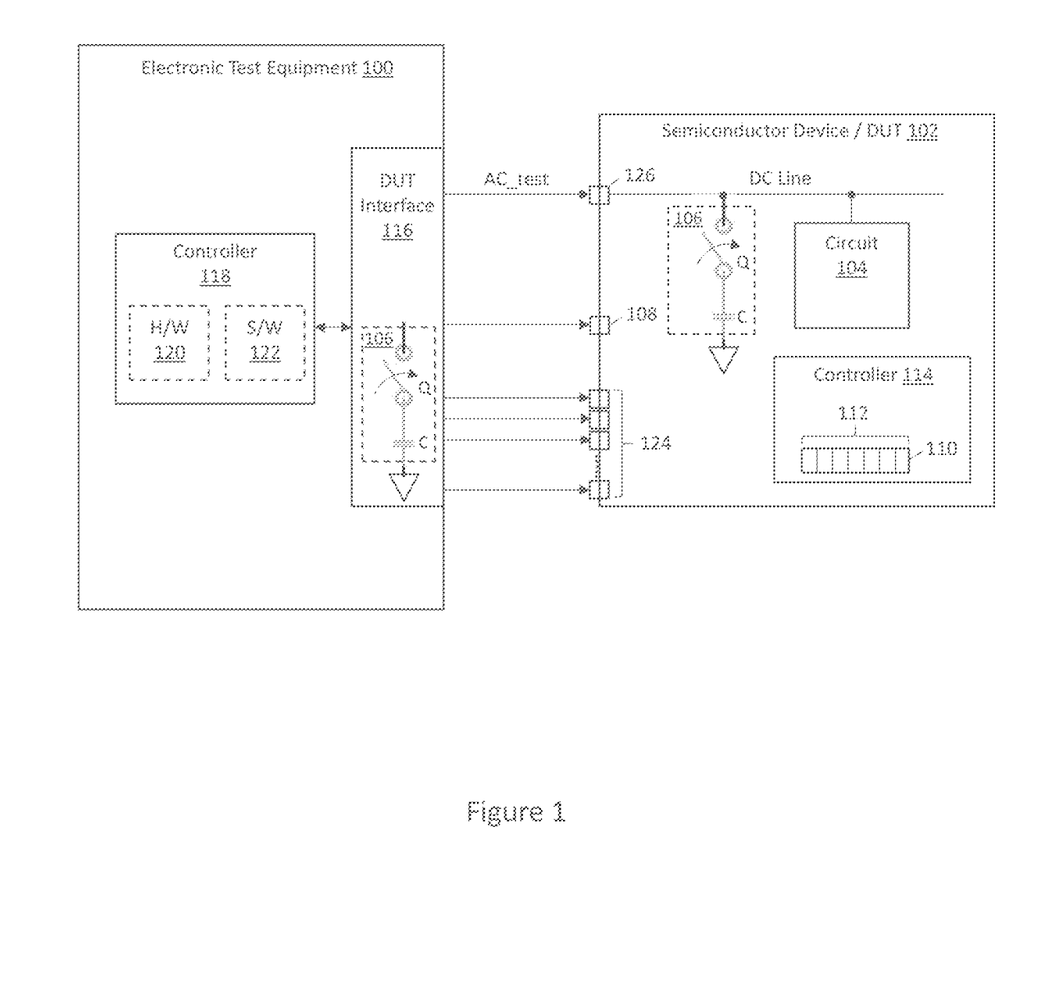
FIG. 1 illustrates a block diagram of an embodiment of an electronic test equipment apparatus for testing semiconductor devices.

FIG. 1 illustrates an embodiment of an electronic test equipment apparatus 100 for testing semiconductor devices 102. The semiconductor devices 102 tested by the electronic test equipment apparatus 100 may be semiconductor chips (dies) on a common wafer, singulated bare (unpackaged) semiconductor chips, packaged semiconductor chips, or higher-level electronic assemblies including one or more semiconductor chips.

In each case, the device under test (DUT) 102 includes a DC line ('DC Line'), a circuit 104 electrically connected to the DC line, and a decoupling structure 106 which includes a capacitor (C) and a switch device (Q) such as a transistor like a MOSFET (metal-oxide-semiconductor field effect transistor) having a low ohmic channel monolithically integrated in the semiconductor device 102, an external transistor or external relay, a MEMS (microelectromechanical system), etc. The switch device Q of the decoupling structure 106 is configured to electrically connect the capacitor C to the DC line or electrically disconnect the capacitor C from the DC line, depending on the state of the switch device Q. The switch device Q and the capacitor C of the decoupling structure 106 may be integrated on the same semiconductor chip as the circuit 104 and DC line powering the circuit 104, or may be included in the same package or assembly as the semiconductor device 102 with the circuit 104. The semiconductor device 102 may include more than one circuit 104. For example, the semiconductor device 102 may include one or more circuits 104 powered by the same or different voltage domains.

The DC line is configured to carry either a DC signal or a DC voltage to the circuit 104 included in the semiconductor device 102. In the case of a DC signal, the DC line may carry a signal for controlling one or more switching devices such as one or more transistors or transistor cells included in the circuit 104. For example, the semiconductor device 102 may be an RF or power transistor device and the circuit 104 may include one or more RF transistors or transistor cells of a power transistor. In the case of a DC voltage, the DC line supplies power to the circuit 104. The DC line may be the only DC line that supplies power to the circuit 104, or the circuit 104 may be powered by more than one DC line.

The semiconductor device 102 also includes a terminal 108 or a register 110 for controlling the state of the switch device Q of the decoupling structure 106. In the case of a terminal 108, the state of the switch device Q is controlled outside the semiconductor device 102. The terminal 108 may be a terminal dedicated just for controlling the state of the switch device Q. The terminal 108 may instead by a multiplexed terminal used for another purpose than just controlling the state of the switch device Q. During testing of the semiconductor device 102, the multiplexed terminal is used for controlling the state of the switch device Q. In the case of a register 110, one or more bits 112 of the register 110 may be set to a value which indicates whether the switch device Q is to be enabled or disabled. In one embodiment, the semiconductor device 102 includes a controller 114 for setting the state of the switch device Q. For example, the controller 114 may access the register 110 which stores the value indicating which state the switch device Q should be placed in.

In a first state, the switch device Q of the decoupling structure 106 electrically connects the capacitor C of the decoupling structure 106 to the DC line that is electrically connected to the circuit 104. In the case of a DC voltage supply line and a decoupling capacitor C, the decoupling capacitor C absorbs AC signal variation on the DC voltage supply line when the switch device Q is in the first state. In a second state, the switch device Q of the decoupling structure 106 electrically disconnects the capacitor C of the decoupling structure 106 from the DC line. The AC signal absorption function provided by the decoupling structure 106 is disabled when the switch device Q is in the second state.

The electronic test equipment apparatus 100 includes a DUT interface 116 for contacting the semiconductor device 102 as part of a test procedure and a controller 118 for controlling the state of the switch device Q of the decoupling structure 106 during a test sequence for the DUT 102. The controller 118 of the electronic test equipment apparatus 100 may include any typical hardware (H/W) 120 and software (S/W) 122 used to carry out test procedures on semiconductor devices 102. For example, the controller 118 of the electronic test equipment apparatus 100 may be a computer that synchronizes one or more source and capture instruments of the electronic test equipment apparatus 100.

During a first part of a test sequence, the controller 118 of the electronic test equipment apparatus 100 enables the switch device Q of the decoupling structure 106 so as to electrically connect the capacitor C of the decoupling structure 106 to the DC line of the DUT 102 via the switch device Q, applies a test signal to the DUT 102 while the capacitor C is electrically connected to the DC line and measures a response of the circuit 104. The test signal is a signal which changes a state of the DUT 102, and when the state is being changed, the capacitor C of the decoupling structure 106 has already been enabled by placing the switch device Q in a conductive state so as to mitigate any resulting supply line variation caused by changing the state of the DUT 102. For example, the test signal may program the DUT 102, may change a state of the circuit 104, may change one or more bits 112 of a register 110, etc. The stimulus applied to the DUT 102 by the test signal is not necessarily applied to the DC line, but may instead be applied to other I/O (input/output) terminals 124 of the DUT 102.

During a second part of the test sequence, the controller 118 of the electronic test equipment apparatus 100 disables the switch device Q of the decoupling structure 106 so as to electrically disconnect the capacitor C of the decoupling structure 106 from the DC line of the DUT 102 via the switch device Q, injects an AC signal onto the DC line after the capacitor C of the decoupling structure 106 is electrically disconnected from the DC line, and measures a response of the DUT circuit 104 to the AC signal.

In one embodiment, the DC line of the DUT 102 is a DC voltage supply line for powering the DUT circuit 104, the capacitor C of the decoupling structure 106 is a decoupling capacitor C, and the controller 118 of the electronic test equipment apparatus 100 measures the response of the DUT circuit 104 to the AC signal during the second part of the test sequence, e.g., by calculating a power supply rejection ratio (PSRR) and/or other parameters for the DUT circuit 104 in response to the AC signal being injected onto the DC voltage supply line via a corresponding power terminal 126 of the DUT 102 after the decoupling capacitor C is electrically disconnected from the DC voltage supply line. The response of the circuit 104 during the first part of the test sequence may be measured by injecting the same AC signal ('AC_test') onto the DC line while the capacitor C is electrically connected to the DC line and measuring the response of the circuit 104 to the AC signal. This way, the controller 118 of the electronic test equipment apparatus 100 may apply the AC signal to the DC line of the DUT 102 during both the first part and the second part of the test sequence. In another embodiment, measuring the response of the DUT circuit 104 to the AC signal during the second part of the test sequence includes testing a VCO (voltage-controlled oscillator) tuning voltage for the DUT 102. In this case, the controller 118 of the electronic test equipment apparatus 100 may assess how high frequency variations on the DC voltage supply line affects VCO tuning voltage behaviour of the DUT 102, without the decoupling capacitor C influencing the test results.

The decoupling structure 106 enabled during the first part of the test sequence and disabled during the second part of the test sequence may be included in the DUT 102 and/or may be included in the DUT interface 116 of the electronic test equipment apparatus 100, as indicated by the corresponding dashed boxes in FIG. 1. In the case of the decoupling structure 106 being included in the DUT 102, after completion of the test sequence, the controller 118 of the electronic test equipment apparatus 100 may set the switch device Q of the decoupling structure 106 to a default state in which the capacitor C of the decoupling structure 106 remains electrically connected to the DC line through the switch device Q. This way, the semiconductor device 102 is set to a default state after testing and in which the decoupling structure 106 is enabled for normal (field use) operation of the device 102. If a controller 114 included in the semiconductor device 102 is configured to control the state of the switch device Q of the decoupling structure 106, the default state of the decoupling structure 106 may be changed in the field during normal operation of the device 102, to disable the decoupling structure 106. Such flexibility may be beneficial, for example, to recharacterize the device 102 and/or assess operation of the device 102 in the field without the decoupling structure 106 being enabled.

Figure 2:
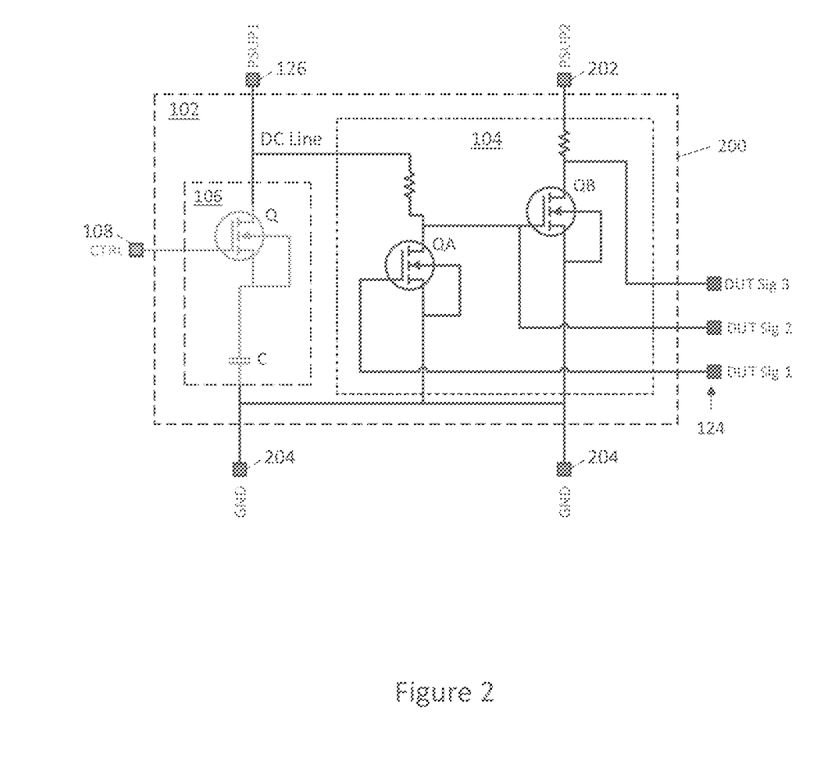
FIG. 2 illustrates a simplified schematic diagram of an embodiment of a semiconductor device having a controllable decoupling structure integrated in the device.

FIG. 2 illustrates a simplified view of an embodiment of the semiconductor device 102 in which the switch device Q and the capacitor C of the decoupling structure 106 are integrated in the same semiconductor chip 200. According to this embodiment, the switch device Q is enabled or disabled by the controller 118 of the electronic test equipment apparatus 100 toggling a signal ('CTRL') driven onto a terminal 108 of the semiconductor device 102 and which is electrically connected to a control node of the switch device Q. In the case of a transistor as the switch device Q, the control node may be a gate terminal of the transistor.

The DC line electrically carries a DC voltage ('PSUP1') to the circuit 104 via a corresponding power terminal 126, according to the embodiment illustrated in FIG. 2. The circuit 104, which is simplified as two transistors QA, QB connected in a cascade configuration for ease of illustration, is also powered by a second DC voltage ('PSUP2') via a second power terminal 202. The semiconductor device 102 includes one or more reference terminals 204 for providing one or more reference levels such as ground ('GND') to the device 102, and I/O terminals 124 for controlling the transistors QA, QB included in the circuit 104 and/or observing the response of the circuit 104 at different nodes within the circuit 104. For example, the output signal ('DUT Sig 3') of the semiconductor device 102 may be measured at one of the I/O terminals 124 and different node signals ('DUT Sig 1', DUT Sig 2') may be measured at other ones of the I/O terminals 124 in FIG. 2.

For the semiconductor device example shown in FIG. 2, an AC signal with an arbitrary frequency may be injected onto the first power supply terminal 126, to examine the influence of the AC signal on device behavior. To avoid suppressing the AC signal by the decoupling structure 106 at higher frequencies, the decoupling capacitor C is electrically disconnected from the first power supply terminal 126 by opening the switch device Q of the decoupling structure 106. Doing so, however, may have a negative impact on device stability during testing in case the semiconductor device 102 has a significant jump in current consumption on the first power supply terminal 126. For example, a significant quick change in the operating condition of the semiconductor device 102 imposed by a characterization procedure carried out by the electronic test equipment apparatus 100 may cause a large spike in current consumption. Changes in the operating condition of the device 102 which result in current spikes on the first power supply terminal 126 are mitigated by ensuring that the switch device Q of the decoupling structure 106 is closed and the decoupling capacitor C is electrically connected to the first power supply terminal 126 before the change is made. The switch device Q of the decoupling structure 106 is opened when sudden spikes in current are not expected, so that the response of the circuit 104 to high frequency variations on the DC line may be assessed without contribution from the decoupling capacitor C.

Figure 3:
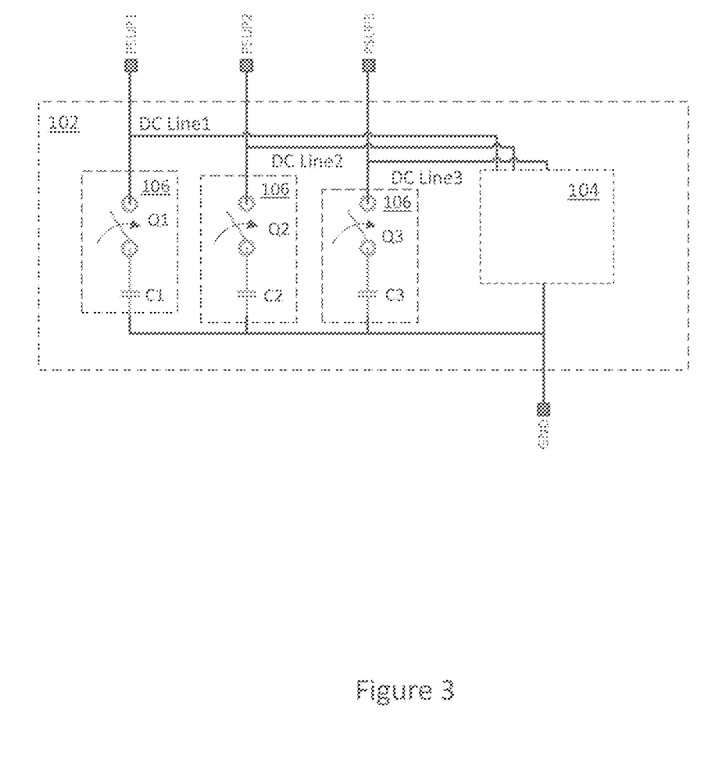
FIG. 3 illustrates a simplified schematic diagram of an embodiment of a semiconductor device having a plurality of DC voltage supply lines and a separate controllable decoupling structure for each DC voltage supply line.

FIG. 3 illustrates a simplified view of an embodiment of the semiconductor device 102 in which the DC line is a first DC voltage supply line ('DC Line1') for powering the circuit 104 and the circuit 104 is powered by at least one additional DC voltage supply line ('DC Line2', 'DC Line3'). This way, the circuit may have separate voltage domains ('PSUP1', 'PSUP2', 'PSUP3') powered by the different DC voltage supply lines. According to this embodiment, a separate switch device (Q1, Q2, Q3) and a separate decoupling capacitor (C1, C2, C3) are associated with each DC voltage supply line powering the circuit 104. Accordingly, the decoupling structures 106 associated with the DC voltage supply lines powering the circuit 104 may be enabled and disabled separately, providing individual control over the different decoupling structures 106. Depending on the type of test sequence, the decoupling structures 106 may be enabled or disabled during the same part or during different parts of a test sequence. Some of the decoupling structures 106 may be enabled at all times or disabled at all times during a test sequence. Accordingly, the response of the circuit 104 to variations on different ones of the DC voltage supply lines may be assessed individually or collectively for subsets of the DC voltage supply lines or for all of the DC voltage supply lines together by enabling and disabling the different decoupling structures 106 during corresponding parts of a test sequence.

Figure 4:
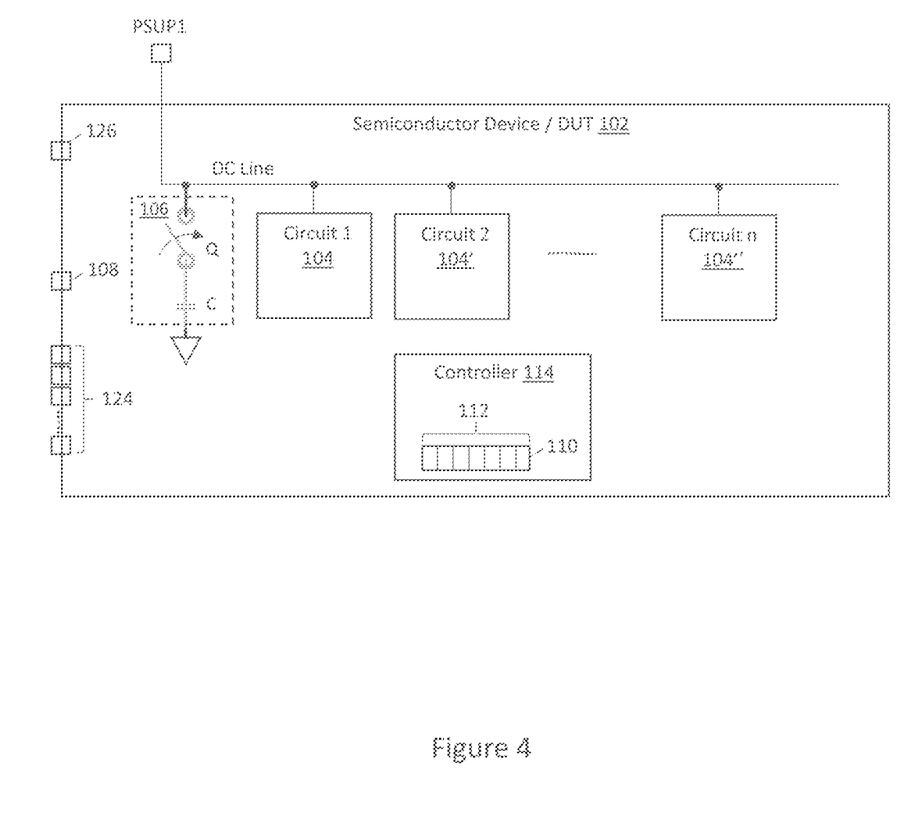
FIG. 4 illustrates a simplified schematic diagram of an embodiment of a semiconductor device having a plurality of circuits powered by the same DC voltage supply line and a single controllable decoupling structure for the DC voltage supply line.

FIG. 4 illustrates a simplified view of an embodiment of the semiconductor device 102 in which the DC line is a DC voltage supply line for powering the circuit 104 at a voltage level ('PSUP1') and at least one other circuit 104', 104" included in the semiconductor device 102 is powered by the same DC voltage supply line. According to this embodiment, a switch device Q and a decoupling capacitor C of a single decoupling structure 106 are associated with the same DC voltage supply line powering the circuits 104, 104', 104". This way, the decoupling function for the circuits 104, 104', 104" powered by the same DC voltage supply line is controlled using the same switch device Q, providing singular control over the decoupling function. Accordingly, the response of the circuits 104, 104', 104" to variations on the same DC voltage supply line may be assessed at the same time via the same part of a test sequence.

As previously explained herein, the DUT interface 116 of the electronic test equipment apparatus 100 may include the decoupling structure 106. That is, DUT interface 116 may include a capacitor C and a switch device Q configured to electrically connect or disconnect the capacitor C to a DC line within a DUT 102, depending on a state of the switch device Q.

Figure 5:
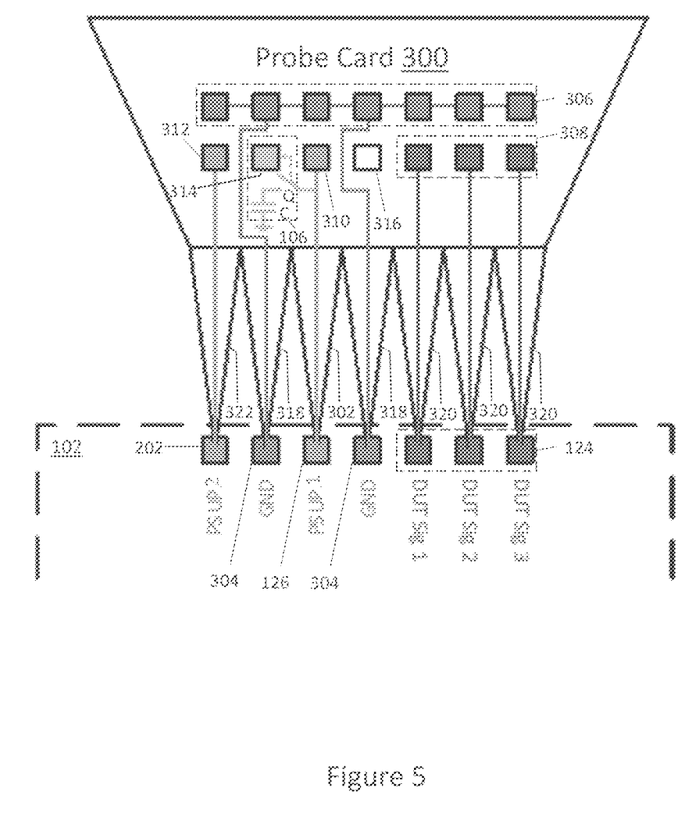
FIG. 5 illustrates an embodiment of a probe card DUT interface of the electronic test equipment apparatus and having a controllable decoupling structure.

FIG. 5 illustrates an embodiment of the DUT interface 116 of the electronic test equipment apparatus 100. According to this embodiment, the DC line of the DUT 102 is a first DC voltage supply line and the DUT interface 116 is a probe card 300 which includes the switch device Q and the capacitor C of the decoupling structure 106 and a power supply prober needle 302 for contacting a terminal 126 of the semiconductor device 102 which corresponds to the first DC voltage supply line during testing of the DUT 102. For ease of illustration, the DUT 102 has the same terminal configuration as shown in FIG. 2. The type and number of terminals for the DUT 102 depends on the type of semiconductor device 102, and is not intended to be limiting. Minimally, the semiconductor device 102 has one or more DC supply terminals 126, 202 and one or more reference terminals 304 such as a ground ('GND') terminal. I/O terminals 124 are utilized during normal operation of the semiconductor device 102, some or all of which may be contacted by the probe card 300 during testing of the semiconductor device 102 to excite the device 102, observe the device response, etc.

The probe card 300 illustrated in FIG. 5 may be a wafer probe card and the DUT 102 may be a semiconductor chip on a wafer. The probe card 300 may be used for testing prior to or post chip singulation.

In each case, the probe card 300 includes respective terminals 306-316 and corresponding pins 302, 318-322 for contacting the corresponding terminals 124, 126, 202, 304 of the semiconductor device 102 accessed by the electronic test equipment apparatus 100 during testing. For example, the probe card 300 includes one or more ground terminals 306 and corresponding ground pins 318 for providing grounded connections to the corresponding ground terminals 304 of the semiconductor device 102. The probe card 300 also includes one or more power terminals 310, 312 and corresponding power pins 302, 322 for providing respective power connections to the corresponding power terminals 126, 202 of the semiconductor device 102. The probe card 300 also includes I/O terminals 308 and corresponding I/O pins 320 for providing respective I/O connections to the I/O terminals 124 of the semiconductor device 102. The probe card 300 also includes a control terminal 314 for controlling the state of the decoupling structure switch device Q included on the probe card 300.

During testing of the semiconductor device 102, the controller 118 of the electronic test equipment apparatus 100 closes the switch device Q of the decoupling structure 106 on the probe card 300 so that the decoupling capacitor C on the probe card 300 is electrically connected to the corresponding power supply prober needle 302 during the first part of a test sequence. With the switch device Q in the closed state, the decoupling capacitor C on the probe card 300 is electrically connected to the DC line of the DUT 102 through the switch device Q of the decoupling structure 106 and the corresponding power supply prober needle 302 of the probe card 300. The controller 118 of the electronic test equipment apparatus 100 applies a test signal to the DUT 102 while the decoupling capacitor C is electrically connected to the DC line via the corresponding power supply prober needle 302, as previously described herein. The controller 118 of the electronic test equipment apparatus 100 opens the decoupling structure switch device Q on the probe card 300 during a second part of the test sequence, so that the decoupling capacitor C on the probe card 300 is electrically disconnected from the power supply prober needle 302 during the second part of the test sequence. With the switch device Q in the open state, the decoupling capacitor C on the probe card 300 is electrically disconnected from the DC line of the DUT 102. The controller 118 of the electronic test equipment apparatus 100 injects an AC signal onto the DC line via the corresponding power supply prober needle 302 after the decoupling capacitor C is electrically disconnected from the power supply prober needle 302 and hence from the DC line of the DUT 102, and measures a response such as PSRR of the DUT circuit 104 to the AC signal.

Figure 6:
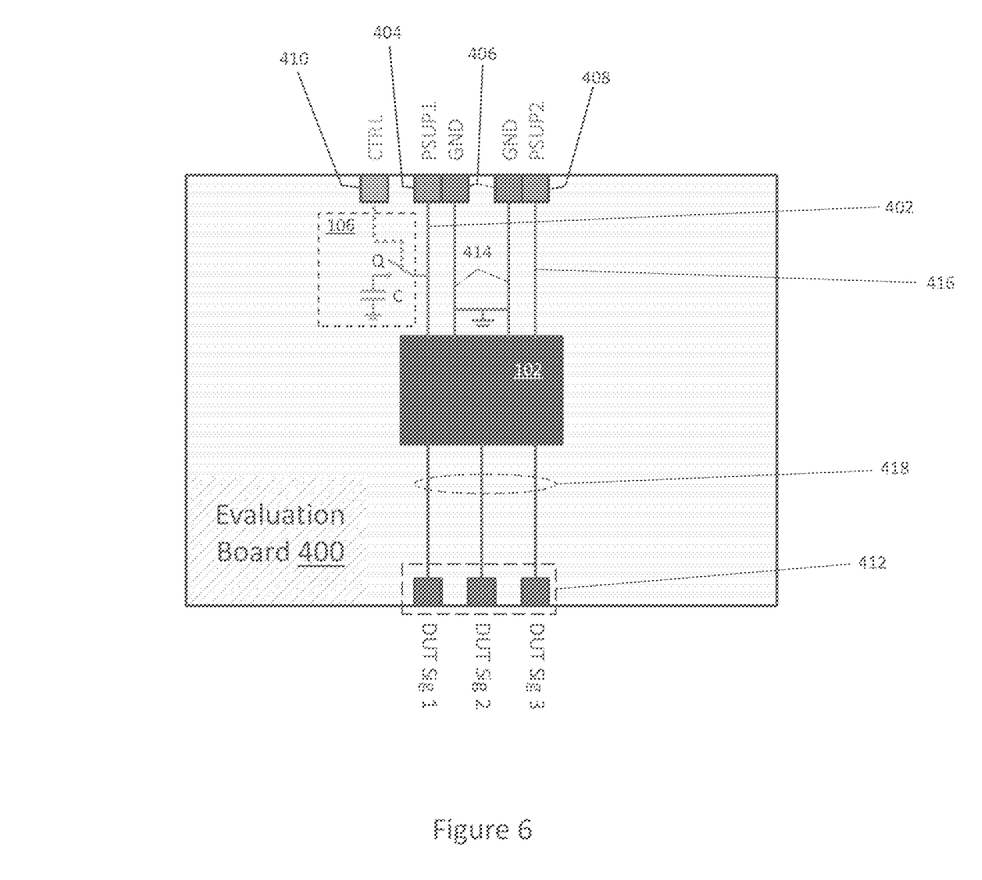
FIG. 6 illustrates an embodiment of a tester card DUT interface of the electronic test equipment apparatus and having a controllable decoupling structure.

FIG. 6 illustrates another embodiment of the DUT interface 116 of the electronic test equipment apparatus 100. According to this embodiment, the DC line of the DUT 102 is a first DC voltage supply line and the DUT interface 116 is an evaluation board 400 such as a printed circuit board (PCB) which comprises the switch device Q and the capacitor C of the decoupling structure 106 and a first power supply line 402 for powering the first DC voltage supply line of the DUT 102 during testing of the semiconductor device. The semiconductor device 102 is configured to be mounted to the evaluation board 400 during the testing of the semiconductor device 102, e.g., via a socket, an interposer, direct attachment, etc. The terminals of the DUT 102 are not shown in FIG. 6 for ease of illustration. The type and number of terminals for the DUT 102 depends on the type of semiconductor device, as previously explained herein.

The evaluation board 400 illustrated in FIG. 6 may be used to test bare semiconductor chips, packaged semiconductor chips, or electronic assemblies including one or more semiconductor chips. The evaluation board 400 includes respective terminals 404-412 and corresponding lines 402, 414-418 such as metal traces for making electrical connections to the terminals of the semiconductor device 102 accessed by the electronic test equipment apparatus 100 during testing. For example, the evaluation board 400 includes one or more ground terminals 406 and corresponding ground lines 414 for providing grounded connections to the semiconductor device 102. The evaluation board 400 also includes one or more power terminals 404, 408 and corresponding power lines 402, 416 for providing respective power connections to the semiconductor device 102. The evaluation board 400 also includes I/O terminals 412 and corresponding I/O lines 418 for providing I/O connections to the semiconductor device 102. The evaluation board 400 also includes a control terminal 410 for controlling the state of the switch device Q of the decoupling structure 106 included on the evaluation board 400.

During testing of the semiconductor device 102, the controller 118 of the electronic test equipment apparatus 100 closes the switch device Q of the decoupling structure 106 on the evaluation board 400 so that the decoupling capacitor C on the evaluation board 400 is electrically connected to the corresponding power supply line 402 of the evaluation board 400 during a first part of a test sequence. With the switch device Q in the closed state, the decoupling capacitor C on the evaluation board 400 is electrically connected to the corresponding DC line of the DUT 102 through the switch device Q of the decoupling structure 104 and the corresponding power line 402 of the evaluation board 400. The controller 118 of the electronic test equipment apparatus 100 applies a test signal to the DUT 102 while the decoupling capacitor C is electrically connected to the DC line via the corresponding power line 402 of the evaluation board 400, as previously described herein. The controller 118 of the electronic test equipment apparatus 100 opens the switch device Q of the decoupling structure 106 on the evaluation board 400 so that the decoupling capacitor C on the evaluation board 400 is electrically disconnected from the corresponding power supply line 402 of the evaluation board 400 during a second part of the test sequence. With the switch device Q in the open state, the decoupling capacitor C on the evaluation board 400 is electrically disconnected from the corresponding DC line of the DUT 102. The controller 118 of the electronic test equipment apparatus 100 injects an AC signal onto the DC line via the corresponding power supply line 402 of the evaluation board 400 after the decupling capacitor C is electrically disconnected from that power supply line 402, and measures a response such as PSRR of the DUT circuit 104 to the AC signal.

Although the present disclosure is not so limited, the following numbered examples demonstrate one or more aspects of the disclosure.

Example 1. A method of testing a semiconductor device having a DC line configured to carry either a DC signal or a DC voltage and a circuit electrically connected to the DC line, the method comprising: during a first part of a test sequence, enabling a switch device so as to electrically connect a capacitor to the DC line via the switch device and applying a test signal to the circuit while the capacitor is electrically connected to the DC line; and during a second part of the test sequence, disabling the switch device so as to electrically disconnect the capacitor from the DC line via the switch device, injecting an AC signal onto the DC line after the capacitor is electrically disconnected from the DC line, and measuring a response of the circuit to the AC signal.

Example 2. The method of example 1, wherein the test signal initiates a change of state of the circuit prior to injecting the AC signal onto the DC line.

Example 3. The method of examples 1 or 2, wherein the switch device and the capacitor are integrated in the semiconductor device, and wherein enabling the switch device comprises setting one or more bits in a register included in the semiconductor device to a value which indicates the switch device is to be enabled.

Example 4. The method of examples 1 or 2, wherein the switch device and the capacitor are integrated in the semiconductor device, and wherein enabling the switch device comprises toggling a terminal of the semiconductor device which is electrically connected to a control node of the switch device.

Example 5. The method of any of examples 1 through 4, wherein the DC line is a DC voltage supply line for powering the circuit, wherein the capacitor is a decoupling capacitor, and wherein measuring a response of the circuit to the AC signal comprises calculating a power supply rejection ratio for the circuit in response to the AC signal being injected onto the DC voltage supply line after the decoupling capacitor is electrically disconnected from the DC voltage supply line.

Example 6. The method of any of examples 1 through 5, wherein the DC line is a DC voltage supply line for powering the circuit, wherein the capacitor is a decoupling capacitor, and wherein at least one other circuit included in the semiconductor device is powered by the DC voltage supply line.

Example 7. The method of any of examples 1 through 5, wherein the DC line is a DC voltage supply line for powering the circuit, wherein the capacitor is a decoupling capacitor, wherein the circuit is powered by at least one additional DC voltage supply line, and wherein a separate switch device and a separate decoupling capacitor are associated with each DC voltage supply line powering the circuit.

Example 8. The method of any of examples 1 through 7, further comprising: after completion of the test sequence, setting the switch device to a default state in which the capacitor remains electrically connected to the DC line through the switch device.

Example 9. The method of any of examples 1 through 8, wherein measuring the response of the circuit during the first part of the test sequence comprises: injecting the AC signal onto the DC line while the capacitor is electrically connected to the DC line; and measuring the response of the circuit to the AC signal.

Example 10. The method of any of examples 1 through 9, wherein the DC line is a first DC voltage supply line, wherein the switch device and the capacitor are integrated on a probe card, wherein the probe card comprises a power supply prober needle for contacting a terminal of the semiconductor device which corresponds to the first DC voltage supply line during the testing of the semiconductor device, wherein enabling the switch device comprises closing the switch device on the probe card so that the capacitor on the probe card is electrically connected to the power supply prober needle during the first part of the test sequence, and wherein disabling the switch device comprises opening the switch device on the probe card so that the capacitor on the probe card is electrically disconnected from the power supply prober needle during the second part of the test sequence.

Example 11. The method of any of examples 1 through 9, wherein the DC line is a first DC voltage supply line, wherein the switch device and the capacitor are integrated on an evaluation board having a power supply line for powering the first DC voltage supply line during the testing of the semiconductor device, wherein the semiconductor device is mounted to the evaluation board during the testing of semiconductor device, wherein enabling the switch device comprises closing the switch device on the evaluation board so that the capacitor on the evaluation board is electrically connected to the power supply line of the evaluation board during the first part of the test sequence, and wherein disabling the switch device comprises opening the switch device on the evaluation board so that the capacitor on the evaluation board is electrically disconnected from the power supply line of the evaluation board during the second part of the test sequence.

Example 12. A semiconductor device, comprising: a DC line configured to carry either a DC signal or a DC voltage; a circuit electrically connected to the DC line; a capacitor; a switch device configured to electrically connect the capacitor to the DC line or electrically disconnect the capacitor from the DC line, depending on a state of the switch device; and a terminal or a register for controlling the state of the switch device, wherein in a first state, the switch device is configured to electrically connect the capacitor to the DC line, wherein in a second state, the switch device is configured to electrically disconnect the capacitor from the DC line.

Example 13. The semiconductor device of example 12, wherein a default state of the switch device is to electrically connect the capacitor to the DC line.

Example 14. The semiconductor device of examples 12 or 13, further comprising a controller configured to set the state of the switch device so that the switch device is in the first state during a first part of a test sequence applied to the semiconductor device and so that the switch device is in the second state during a second part of the test sequence.

Example 15. The semiconductor device of example 14, wherein the controller is configured to access a register included in the semiconductor device and which stores a value indicating which state the switch device should be placed in.

Example 16. The semiconductor device of any of examples 12 through 15, wherein the DC line is a DC voltage supply line for powering the circuit, wherein the capacitor is a decoupling capacitor, and wherein at least one other circuit included in the semiconductor device is powered by the DC voltage supply line.

Example 17. The semiconductor device of any of examples 12 through 15, wherein the DC line is a DC voltage supply line for powering the circuit, wherein the capacitor is a decoupling capacitor, wherein the circuit is powered by at least one additional DC voltage supply line, and wherein a separate switch device and a separate decoupling capacitor are associated with each DC voltage supply line powering the circuit.

Example 18. An electronic test equipment apparatus, comprising: an interface for a device under test (DUT), the DUT having a DC line configured to carry either a DC signal or a DC voltage and a circuit electrically connected to the DC line, the interface comprising a capacitor and a switch device configured to electrically connect or disconnect the capacitor to the DC line of the DUT, depending on a state of the switch device; and a controller configured to control the state of the switch device during a test sequence for the DUT, wherein during a first part of the test sequence, the controller is configured to enable the switch device so as to electrically connect the capacitor to the DC line of the DUT via the switch device and apply a test signal to the DUT while the capacitor is electrically connected to the DC line, wherein during a second part of the test sequence, the controller is configured to disable the switch device so as to electrically disconnect the capacitor from the DC line of the DUT via the switch device, inject an AC signal onto the DC line after the capacitor is electrically disconnected from the DC line, and measure a response of the circuit to the AC signal.

Example 19. The electronic test equipment apparatus of example 18, wherein the test signal initiates a change of state of the DUT prior to injecting the AC signal onto the DC line.

Example 20. The electronic test equipment apparatus of examples 18 or 19, wherein the DC line is a first DC voltage supply line, wherein the DUT interface is a probe card which comprises the switch device, the capacitor and a power supply prober needle for contacting a terminal of the semiconductor device which corresponds to the first DC voltage supply line during the testing of the semiconductor device, wherein the controller is configured to close the switch device on the probe card so that the capacitor on the probe card is electrically connected to the power supply prober needle during the first part of the test sequence, and wherein the controller is configured to open the switch device on the probe card so that the capacitor on the probe card is electrically disconnected from the power supply prober needle during the second part of the test sequence.

Example 21. The electronic test equipment apparatus of example 18 or 19, wherein the DC line is a first DC voltage supply line, wherein the DUT interface is an evaluation board which comprises the switch device, the capacitor and a power supply line for powering the first DC voltage supply line of the DUT during testing of the semiconductor device, wherein the semiconductor device is configured to be mounted to the evaluation board during the testing of the semiconductor device, wherein the controller is configured to close the switch device on the evaluation board so that the capacitor on the evaluation board is electrically connected to the power supply line of the evaluation board during the first part of the test sequence, and wherein the controller is configured to open the switch device on the evaluation board so that the capacitor on the evaluation board is electrically disconnected from the power supply line of the evaluation board during the second part of the test sequence.

Example 22. The electronic test equipment apparatus of any of examples 18 through 21, wherein after completion of the test sequence, the controller is configured to set the switch device to a default state in which the capacitor remains electrically connected to the DC line through the switch device.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of testing a semiconductor device having a DC line configured to carry either a DC signal or a DC voltage and a circuit electrically connected to the DC line, the method comprising:
   during a first part of a test sequence, enabling a switch device so as to electrically connect a capacitor to the DC line via the switch device and applying a test signal to the circuit while the capacitor is electrically connected to the DC line; and
   during a second part of the test sequence, disabling the switch device so as to electrically disconnect the capacitor from the DC line via the switch device, injecting an AC signal onto the DC line after the capacitor is electrically disconnected from the DC line, and measuring a response of the circuit to the AC signal.

2. The method of claim 1, wherein the test signal initiates a change of state of the circuit prior to injecting the AC signal onto the DC line.

3. The method of claim 1, wherein the switch device and the capacitor are integrated in the semiconductor device, and wherein enabling the switch device comprises setting one or more bits in a register included in the semiconductor device to a value which indicates the switch device is to be enabled.

4. The method of claim 1, wherein the switch device and the capacitor are integrated in the semiconductor device, and wherein enabling the switch device comprises toggling a terminal of the semiconductor device which is electrically connected to a control node of the switch device.

5. The method of claim 1, wherein the DC line is a DC voltage supply line for powering the circuit, wherein the capacitor is a decoupling capacitor, and wherein measuring a response of the circuit to the AC signal comprises calculating a power supply rejection ratio for the circuit in response to the AC signal being injected onto the DC voltage supply line after the decoupling capacitor is electrically disconnected from the DC voltage supply line.

6. The method of claim 1, wherein the DC line is a DC voltage supply line for powering the circuit, wherein the capacitor is a decoupling capacitor, and wherein at least one other circuit included in the semiconductor device is powered by the DC voltage supply line.

7. The method of claim 1, wherein the DC line is a DC voltage supply line for powering the circuit, wherein the capacitor is a decoupling capacitor, wherein the circuit is powered by at least one additional DC voltage supply line, and wherein a separate switch device and a separate decoupling capacitor are associated with each DC voltage supply line powering the circuit.

8. The method of claim 1, further comprising:
after completion of the test sequence, setting the switch device to a default state in which the capacitor remains electrically connected to the DC line through the switch device.

9. The method of claim 1, wherein the DC line is a first DC voltage supply line, wherein the switch device and the capacitor are integrated on a probe card, wherein the probe card comprises a power supply prober needle for contacting a terminal of the semiconductor device which corresponds to the first DC voltage supply line during the testing of the semiconductor device, wherein enabling the switch device comprises closing the switch device on the probe card so that the capacitor on the probe card is electrically connected to the power supply prober needle during the first part of the test sequence, and wherein disabling the switch device comprises opening the switch device on the probe card so that the capacitor on the probe card is electrically disconnected from the power supply prober needle during the second part of the test sequence.

10. The method of claim 1, wherein the DC line is a first DC voltage supply line, wherein the switch device and the capacitor are integrated on an evaluation board having a power supply line for powering the first DC voltage supply line during the testing of the semiconductor device, wherein the semiconductor device is mounted to the evaluation board during the testing of semiconductor device, wherein enabling the switch device comprises closing the switch device on the evaluation board so that the capacitor on the evaluation board is electrically connected to the power supply line of the evaluation board during the first part of the test sequence, and wherein disabling the switch device comprises opening the switch device on the evaluation board so that the capacitor on the evaluation board is electrically disconnected from the power supply line of the evaluation board during the second part of the test sequence.

* * * * *

UNITED STATES PATENT AND TRADEMARK OFFICE
CERTIFICATE OF CORRECTION

| | | |
|---|---|---|
| PATENT NO. | : 11,243,244 B2 | |
| APPLICATION NO. | : 16/598532 | |
| DATED | : February 8, 2022 | |
| INVENTOR(S) | : di Martino et al. | |

It is certified that error appears in the above-identified patent and that said Letters Patent is hereby corrected as shown below:

In the Claims

Column 14, Line 21 (Claim 10) please change "of semiconductor" to -- of the semiconductor --

Signed and Sealed this
Third Day of May, 2022

Katherine Kelly Vidal
*Director of the United States Patent and Trademark Office*